United States Patent
Pon et al.

(10) Patent No.: US 11,552,051 B2
(45) Date of Patent: Jan. 10, 2023

(54) ELECTRONIC DEVICE PACKAGE

(71) Applicant: Intel Corporation, Santa Clara, CA (US)

(72) Inventors: Florence R. Pon, Folsom, CA (US); John G. Meyers, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/490,540

(22) PCT Filed: Apr. 1, 2017

(86) PCT No.: PCT/US2017/025651
§ 371 (c)(1),
(2) Date: Aug. 31, 2019

(87) PCT Pub. No.: WO2018/182752
PCT Pub. Date: Oct. 4, 2018

(65) Prior Publication Data
US 2020/0013756 A1 Jan. 9, 2020

(51) Int. Cl.
*H01L 23/52* (2006.01)
*H01L 25/065* (2006.01)
*H01L 23/31* (2006.01)
*H01L 23/00* (2006.01)

(52) U.S. Cl.
CPC ...... *H01L 25/0657* (2013.01); *H01L 23/3107* (2013.01); *H01L 24/49* (2013.01); *H01L 2224/32145* (2013.01); *H01L 2224/73265* (2013.01); *H01L 2224/8592* (2013.01); *H01L 2225/0651* (2013.01); *H01L 2924/15311* (2013.01)

(58) Field of Classification Search
CPC combination set(s) only.
See application file for complete search history.

(56) References Cited

U.S. PATENT DOCUMENTS

| | | |
|---|---|---|
| 2003/0038355 A1 | 2/2003 | Derderian |
| 2006/0151865 A1* | 7/2006 | Han .................. H01L 24/85 257/686 |
| 2007/0194415 A1* | 8/2007 | Seng .................. H01L 25/50 257/678 |

(Continued)

OTHER PUBLICATIONS

PCT Application No. PCT/US2017/025651 Filing date Apr. 1, 2017, Florence R. Pon, International Search Report dated Oct. 10, 2019; 12 Pages.

*Primary Examiner* — Moin M Rahman
(74) *Attorney, Agent, or Firm* — Schwabe, Williamson & Wyatt, P.C.

(57) ABSTRACT

Electronic device package technology is disclosed. An electronic device package in accordance with the present disclosure can include a substrate, a plurality of electronic components in a stacked relationship, and an encapsulant material encapsulating the electronic components. Each of the electronic components can be electrically coupled to the substrate via a wire bond connection and spaced apart from an adjacent electronic component to provide clearance for the wire bond connection. The encapsulant can be disposed between center portions of adjacent electronic components. Associated systems and methods are also disclosed.

21 Claims, 4 Drawing Sheets

(56) References Cited

U.S. PATENT DOCUMENTS

| | | | |
|---|---|---|---|
| 2008/0029903 A1* | 2/2008 | Lin | H01L 24/85 |
| | | | 257/E23.125 |
| 2009/0045496 A1 | 2/2009 | Tian et al. | |
| 2010/0102446 A1* | 4/2010 | Katsurayama | H01L 24/32 |
| | | | 257/738 |
| 2011/0062598 A1* | 3/2011 | Lam | H01L 25/0657 |
| | | | 257/777 |
| 2013/0032942 A1* | 2/2013 | Sasaki | H01L 24/92 |
| | | | 257/784 |
| 2015/0243607 A1* | 8/2015 | Jang | H01L 23/552 |
| | | | 438/113 |
| 2015/0311185 A1* | 10/2015 | Ng | H01L 24/85 |
| | | | 257/784 |

* cited by examiner

ELECTRONIC DEVICE PACKAGE

PRIORITY INFORMATION

This application is a 371 U.S. national stage entry of PCT Application Serial No. PCT/US2017/025651, filed Apr. 1, 2017, which is incorporated herein by reference in its entirety.

TECHNICAL FIELD

Embodiments described herein relate generally to electronic device packages, and more particularly to stacked electronic components in electronic device packages.

BACKGROUND

Integrated circuit packaging often includes two or more electronic components (e.g., dies) in a stacked configuration electrically coupled to a package substrate. This arrangement provides a space savings and has therefore become increasingly popular for small form factor applications due to the higher component density that can be provided in devices such as mobile phones, personal digital assistants (PDA), and digital cameras. The stacked dies are typically connected to the substrate by wire bond connections and the dies are offset from one another to provide clearance for the wire bond connections.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" provide express support for plural referents unless the context clearly dictates otherwise. Thus, for example, reference to "a layer" includes a plurality of such layers.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" structures, elements or objects are in physical contact with one another. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

One typical implementation for offsetting stacked dies from one another utilizes a solid dummy silicon spacer that is laminated (e.g., with epoxy adhesive) to the dies. The silicon spacer provides just enough lateral clearance for the wire bonds while occupying all available space in between. Another common implementation utilizes a semi-viscous epoxy die attach material, commonly referred to as Film over Wire (FOW) or "spacerless" stacking. The FOW material is applied to the backside of a wafer prior to wafer dicing, and encapsulates around the wires when the dies are attached. The material is later cured to provide a structural spacer between the dies. The FOW material is laterally coextensive with the dies and therefore occupies all available space between adjacent dies.

Although these typical spacing implementations are effective in providing clearance for wire bond connections, they do have drawbacks. One drawback is that each implementation requires a large quantity of expensive material (e.g., bare silicon or FOW epoxy) to create the offset. Another drawback is that multiple material interfaces must be engineered across the surfaces of the dies. For example, for a 2-active die silicon spacer, there are four material interfaces between the dies, die attach adhesive, and the bare die spacer. This creates an additional engineering challenge and reliability risk. Yet another drawback is that thermal curing must be applied repeatedly to cure these large interfaces as the dies are stacked. This results in the adhesives on the lower dies being over-cured multiple times, which can cause the adhesives to become brittle and lose adhesive and cohesive properties, and also results in numerous long cure process times.

Accordingly, electronic device packages are disclosed that utilize spacers separating stacked electronic components that occupy a relatively small area or volume between adjacent electronic components, which can reduce cure time and therefore avoid over-curing the bottom spacers in the stack. In one aspect, the total number of material interfaces in the electronic component stack is reduced, thus reducing engineering and manufacturing risk. In one example, an electronic device package in accordance with the present disclosure can comprise a substrate, a plurality of electronic components in a stacked relationship, and an encapsulant material encapsulating the electronic components. Each of the electronic components can be electrically coupled to the substrate via a wire bond connection and spaced apart from an adjacent electronic component to provide clearance for the wire bond connection. The encapsulant can be disposed between center portions of adjacent electronic components. Associated systems and methods are also disclosed.

Figure 1:
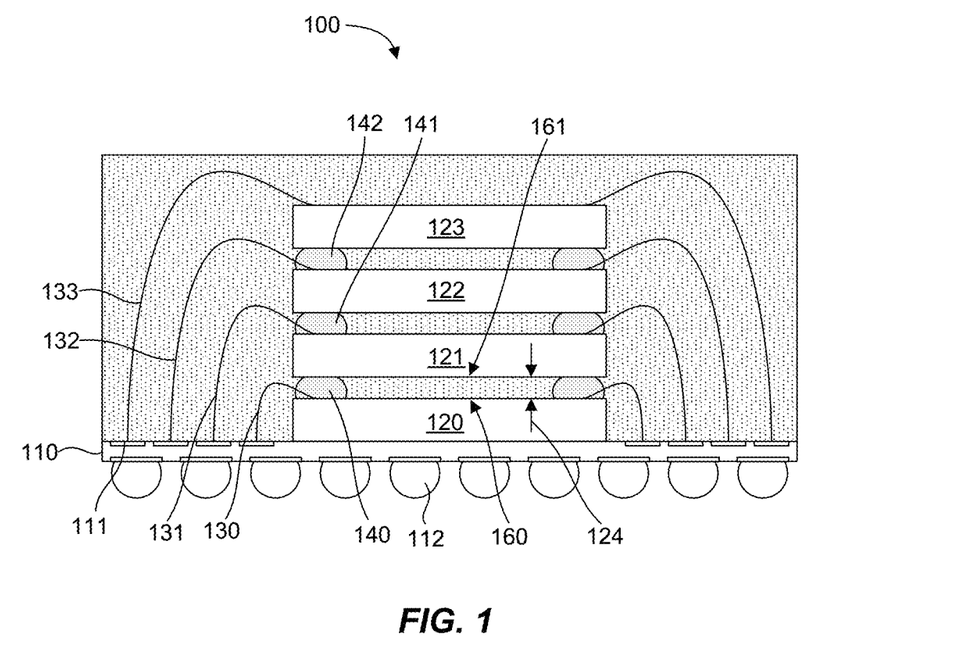
FIG. 1 illustrates a schematic cross-section of an electronic device package in accordance with an example embodiment.

Referring to FIG. 1, an exemplary electronic device package 100 is schematically illustrated in cross-section. The electronic device package 100 can include a substrate 110. The electronic device package 100 can also include electronic components 120-123, which can be operably coupled to the substrate 110 (e.g., by wire bond connections 130-133). An electronic component can be any electronic device or component that may be included in an electronic device package, such as a semiconductor device (e.g., a die, a chip, a processor, computer memory, etc.). Each of the electronic components 120-123 may represent a discrete chip. The electronic components 120-123 may be, include, or be a part of a processor, memory (e.g., ROM, RAM, EEPROM, flash memory, etc.), or an application specific integrated circuit (ASIC). In some embodiments, one or more of the electronic components 120-123 can be a system-on-chip (SOC) or a package-on-package (POP). In some embodiments, the electronic device package 100 can be a system-in-a-package (SIP). In one embodiment, the electronic components 120-123 can be identical, such as computer memory chips, to form a memory stack. The electronic components 120-123 can be disposed on the package substrate 110 in a stacked relationship, for example, to save space and enable smaller form factors. Although four electronic components 120-123 are depicted in FIG. 1, it should be recognized that any suitable number of electronic components can be included in a stack (e.g., 16 or more electronic components), which may be limited only by practical considerations.

The substrate 110 may include typical substrate materials. For example, the substrate 110 may comprise an epoxy-based laminate substrate having a core and/or build-up layers. The substrate 110 may include other suitable types of substrates in other embodiments. For example, the substrate 110 can be formed primarily of any suitable semiconductor material (e.g., a silicon, gallium, indium, germanium, or variations or combinations thereof, among other substrates), one or more insulating layers, such as glass-reinforced epoxy, such as FR-4, polytetrafluoroethylene (Teflon), cotton-paper reinforced epoxy (CEM-3), phenolic-glass (G3), paper-phenolic (FR-1 or FR-2), polyester-glass (CEM-5), ABF (Ajinomoto Build-up Film), any other dielectric material, such as glass, or any combination thereof, such as can be used in printed circuit boards (PCBs).

The substrate 110 may include electrical routing features configured to route electrical signals to or from the electronic components 120-123. The electrical routing features may be internal and/or external to the substrate 110. For example, in some embodiments, the substrate 110 may include electrical routing features such as pads 111, vias, and/or traces (not shown) as commonly known in the art configured to receive interconnect structures (e.g., the wire bond connections 130-133) and route electrical signals to or from the electronic components 120-123. The pads, vias, and traces of the substrate 110 can be constructed of the same or similar electrically conductive materials, or of different electrically conductive materials.

In one aspect, the substrate 110 can be configured to facilitate electrically coupling the electronic device package 100 with an external electronic component, such as a next level substrate (e.g., a circuit board such as a motherboard) to further route electrical signals and/or to provide power. The electronic device package 100 can include interconnects, such as solder balls 112, coupled to the substrate 110 for electrically coupling the electronic device package 100 with an external electronic component.

The electronic components 120-123 can be electrically coupled to the substrate 110 by wire bonding (e.g., the wire bond connections 130-133) to route electrical signals between the respective electronic components 120-123 and the substrate 110. In some embodiments, the wire bond connections 130-133 may be configured to route electrical signals such as, for example, I/O signals and/or power or ground signals associated with the operation of the electronic components 120-123. The electronic components 120-123 can be spaced apart from an adjacent electronic component by any suitable distance 124 that can provide clearance for the wire bond connections (e.g., to prevent electrical shorting). For example, adjacent electronic components 120, 121 can be spaced apart from one another by a distance 124 of at least 30 µm, and may not require more than 300 µm of gap to provide clearance for the wire bond connections. The distance 124 can be selected to accommodate forward or reverse wire bonds, multiple rows of wire bonds, etc. In one aspect, one or more spacers 140-142 can separate adjacent electronic components 120-123 from one another to provide clearance for the wire bond connections 130-132. The spacers 140-142 can be made of any suitable material, such as a polymer (e.g., a thermoset polymer, a thermoplastic polymer, etc.). In some embodiments, the spacers 140-142 can be made of an epoxy polymer.

An encapsulant 150 (e.g., mold compound such as an epoxy) can encapsulate one or more of the electronic components. For example, FIG. 1, shows the encapsulant 150 encapsulating the stacked electronic components 120-123. The encapsulant 150 can be disposed between center portions of adjacent electronic components. For example, the encapsulant 150 can be disposed between center portions 160, 161 of the respective adjacent electronic components 120, 121. Thus, the encapsulant material 150 can surround the electronic components 120-123 and fill in the spaces or voids between the electronic components. The spacers 140-142 can be configured to facilitate flow or movement of the encapsulant material into the spaces or voids between the electronic components 120-123.

Figure 2A:
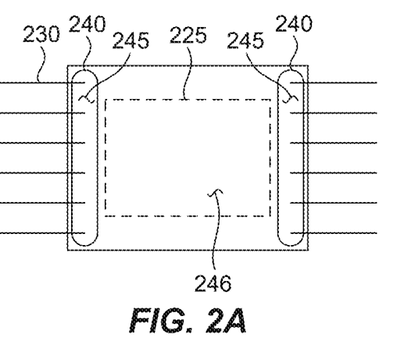
FIGS. 2A-2F illustrate top views of spacer configurations in accordance with several examples embodiments.
Figure 2B:
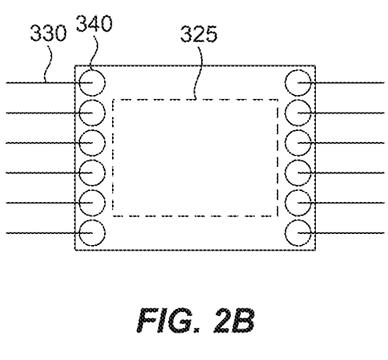
Figure 2C:
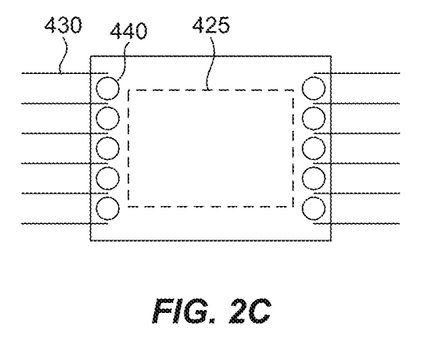
Figure 2D:
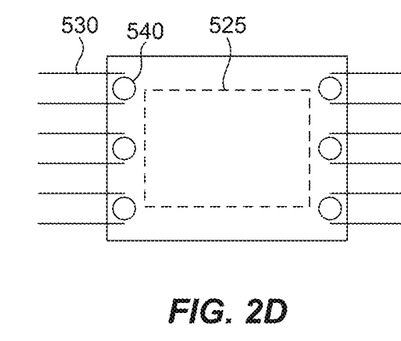
Figure 2E:
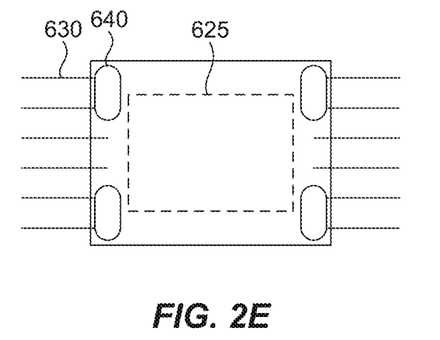

FIGS. 2A-2F illustrate top views of spacer configurations or arrangements, in accordance with several examples of the present disclosure. A spacer can have any suitable shape or configuration. In one aspect, a spacer can have a bump configuration (see the side view of FIG. 1), which may result from the spacer material and the application process, which is described in more detail below with reference to FIGS. 3B and 3C. FIGS. 2A and 2E show spacers (240 in FIG. 2A and 640 in FIG. 2E) having elongated (e.g., wall) bump configurations, while FIGS. 2B-2D and 2F show spacers (340, 440, 540, 740 in FIGS. 2B-2D and 2F, respectively) having dot bump configurations. Although the spacers in FIGS. 2A-2F are discussed having bump configurations, it should be recognized that these spacers can have any suitable shape or configuration, which may depend on the spacer material and application process.

Figure 2F:
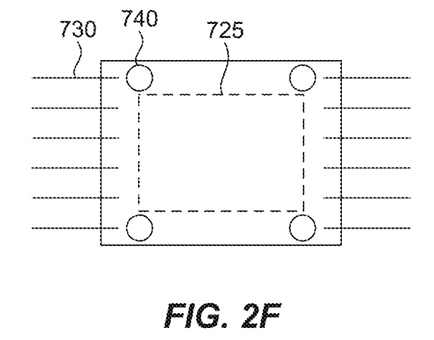

A spacer can be disposed about an electronic component anywhere the spacer can create sufficient space or a gap between adjacent electronic components. For example, as shown in FIGS. 2A-2F, at least some of the spacers 240, 340, 440, 540, 640, 740 are disposed between peripheral portions of adjacent electronic components, shown as being outside peripheral boundary lines 225, 325, 425, 525, 625, 725 in the respective figures. The peripheral portions can include attachment features such as wire bond landing pads (not shown) for coupling with wire bonds 230, 330, 430, 530, 630, 730. In some embodiments, a spacer can be disposed at least partially over one or more wire bond connections. For example, the spacers 240, 340, 640 of FIGS. 2A, 2B, and 2E are disposed at least partially over one or more wire bond connections 230, 330, 630, respectively. In other embodiments, a spacer can be disposed between laterally adjacent wire bond connections. For example, the spacers 440, 540 of FIGS. 2C and 2D are disposed between laterally adjacent wire bond connections 430, 530, 630, respectively. In another embodiment, a spacer can be disposed in a peripheral portion and not be disposed on or between wire bond connections, as shown in FIG. 2F where at least some of the spacers 740 are disposed along an edge or side of an electronic component where there are no wire bond connections. In addition, as shown in FIG. 2F, at least one of the spacers 740 can be disposed partially between center portions of adjacent electronic components, shown as being inside the peripheral boundary line 725 in the figure. Thus, a spacer having any suitable configuration (e.g., a bump configuration) can be located anywhere between adjacent electronic components in any arrangement or pattern. Such spacer arrangements or patterns can be configured to facilitate movement or flow of encapsulant material between adjacent electronic components.

In one aspect, spacer size (e.g., volume) can be minimized to facilitate movement or flow of encapsulant material between adjacent electronic components while also providing sufficient mechanical support and spacing for the electronic components during assembly (e.g., placement in a stacked configuration and wire bonding, discussed in more detail below with reference to FIGS. 3B and 3C). In some embodiments, a contact interface area of a spacer and an electronic component surface can be small compared to the area of the electronic component surface. For example, the total area of an interface 245 of the spacers 240 and a surface 246 of the electronic component in FIG. 2A can be less than or equal to 10% of a surface area of the surface 246. On the other hand, encapsulant material between adjacent electronic components may be maximized. Thus, a contact interface area of encapsulant material and the electronic component surface 246 can be any exposed surface area that is not occupied by the spacers 240 in FIG. 2A (assuming the spacers 240 remain after application of the encapsulant material). In this case, the interface area of encapsulant material and the surface 246 can be greater than or equal to 50% of the surface area of the surface 246. Thus, the encapsulant can occupy or contact the majority of the area of the opposing electronic component surfaces, and fill in the majority of the volume between the adjacent electronic components.

In some embodiments, the encapsulant material is not completely (i.e., only partially or incompletely) distributed between adjacent electronic components. In other embodiments, the encapsulant material is not disposed between adjacent electronic components at all (i.e., is absent), and therefore a void exists between the adjacent electronic components. These embodiments may include devices, such as MEMS devices, exposed between the adjacent electronic components.

Figure 3A:
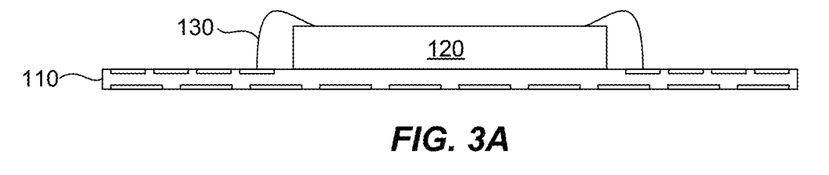
FIGS. 3A-3D illustrate a method for making an electronic device package in accordance with an example embodiment.
Figure 3B:
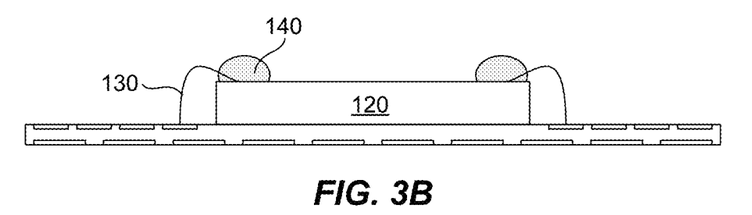
Figure 3C:
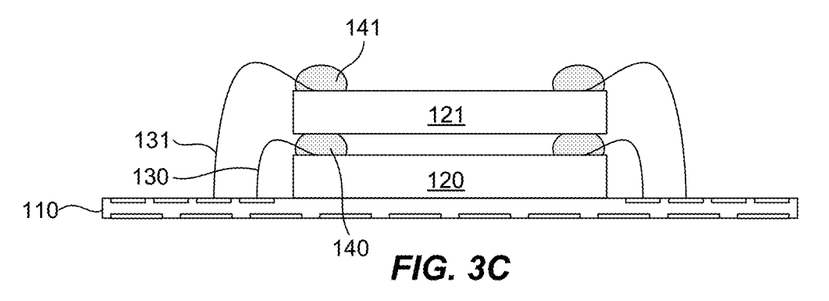

FIGS. 3A-3D illustrate aspects of exemplary methods or processes for making an electronic device package, such as the electronic device package 100. FIG. 3A illustrates the electronic component 120 disposed on the substrate 110. The wire bond connection 130 can be formed between the electronic component 120 and the substrate 110. The spacer 140 can be formed on the electronic component 120, as shown in FIG. 3B. The spacer 140 can be configured to separate the electronic component 120 from the electronic component 121, which is subsequently stacked on the electronic component 120 as shown in FIG. 3C, to provide clearance for the wire bond connection 130. The spacer 140 can be formed on the electronic component 120, the electronic component 121, or both electronic components 120, 121, as desired.

A spacer as disclosed herein can be of any suitable configuration (i.e., material composition and/or physical structure) that can mechanically maintain the space or gap 124 (see FIG. 1) between adjacent electronic components during assembly of the electronic components (i.e., stacking and wire bonding) and while the electronic components are encapsulated (see FIG. 3D), after which the encapsulant material 150 disposed between the electronic components can provide mechanical support for the electronic components.

In some embodiments, spacers can be made of an epoxy polymer material dispensed in viscous form (e.g., a paste, a liquid, etc.) on the electronic components, such that the epoxy can form an adhesive bond between adjacent electronic components. Because the spacers can be minimized in size (e.g., volume), the epoxy can be rapidly and at least partially cured (e.g., snap-cured) sufficient to provide the desired mechanical and structural benefits described above. Such rapid curing can minimally expose the spacers and other components of the electronic device package 100 to the curing media (e.g., heat, ultrasonic frequencies, radio frequencies, ultra-violet light, laser light, etc. that may cure the epoxy) throughout the course of the electronic component stacking assembly process, which can avoid overcuring of the bottom or lower spacers (e.g., the spacer 140). Curing may be done at each level of the electronic component stack as the stack is assembled or bulk cured as allowable. In one aspect, utilizing epoxy polymer material can provide a total of two material interfaces in a 2-active electronic component stack, thus reducing engineering and manufacturing risk.

In other embodiments, spacers can be made of silicon, film over wire (FOW) material, etc., which may be configured as pre-formed shapes and applied to the electronic components. In another embodiment, spacers can be constructed as layers of laminated material on the electronic components, and can therefore include a variety of material types (e.g., ceramic, glass, organic material, adhesive, etc.).

As mentioned above, spacers provide at least temporary support while the electronic components are stacked, while the encapsulant provides long term permanent support. Thus, in some embodiments, spacers can be made or constructed of any suitable material that may facilitate removal of the spacer upon encapsulation. For example, spacers can be made of a sacrificial material that can maintain sufficient dimensional stability to facilitate formation of the electronic component stack as described herein, and also facilitate removal of the spacer when desired (e.g., upon application of an encapsulant or mold compound 150 discussed below). In one aspect, the sacrificial material can be thermally decomposable, although any suitable type of sacrificial material can be utilized, such as liquid soluble materials. Examples of suitable sacrificial materials include polynorbornene and/or polycarbonate based polymers that decompose when exposed to a relatively high temperature. Such temperature may be at or above 180 degrees Celsius in some embodiments. In other embodiments, the temperature may be at or above 200 degrees Celsius. In some embodiments, wax may serve as a suitable spacer material, which may be temporary and consumable.

Figure 3D:
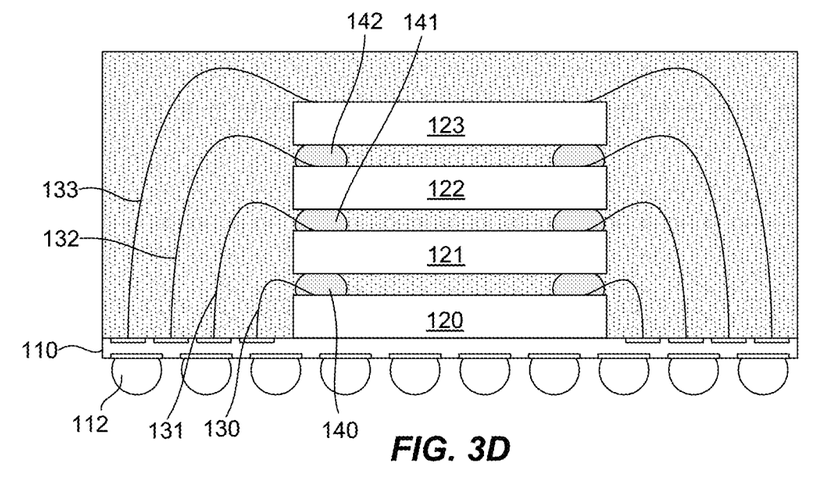

With the electronic component 121 stacked on the electronic component 120 as shown in FIG. 3C, the wire bond connection 131 can be formed between the electronic component 121 and the substrate 110. The spacer 141 can be formed as discussed above to at least temporarily support and provide separation between the electronic component 121 and the electronic component 122, which is subsequently stacked on the electronic component 121. In one aspect, FIG. 3C illustrates an electronic device package precursor, which includes the substrate 210, stacked electronic components 120, 121, and the spacer 140 providing clearance between the electronic components 120, 121 for the wire bond 130. The electronic device package precursor can be subjected to further processing to create an electronic device package in accordance with the present disclosure as described below. For example, the above described processes can be repeated until all electronic components have been stacked, separated by spacers, and wire bonded to the substrate 110, as shown in FIG. 3D.

Once all electronic components 120-123 have been assembled and electrically coupled to the substrate 110, the electronic components can be encapsulated, such as by a mold compound, to provide protection and support for the electronic components. The electronic components can be encapsulated by any suitable technique or method, such as epoxy transfer mold, epoxy compression mold, epoxy dispense encapsulation, etc. The encapsulant material 150 can fill in between the electronic components 120-123 and can provide primary mechanical support for the electronic components as opposed to the spacers 140-142 providing such support. The encapsulant material 150 can also fill in between and around the wire bond connections 130-133 to provide support for the wire bond connections. Any suitable encapsulant material can be used that can provide the desired mechanical properties for maintaining separation of the electronic components 120-123 from one another to prevent shorting. In addition, encapsulant material can be configured to have any other desirable property or provide any suitable benefit (e.g., a thermal property, an electromagnetic property, an optical property (e.g., transparent/translucent), an RF property, an electrical property, a shielding property, etc.). The electronic device package 100 can be completed by coupling the solder balls 112 to the substrate 110 and singulating (if applicable) from other electronic device packages.

Figure 4:
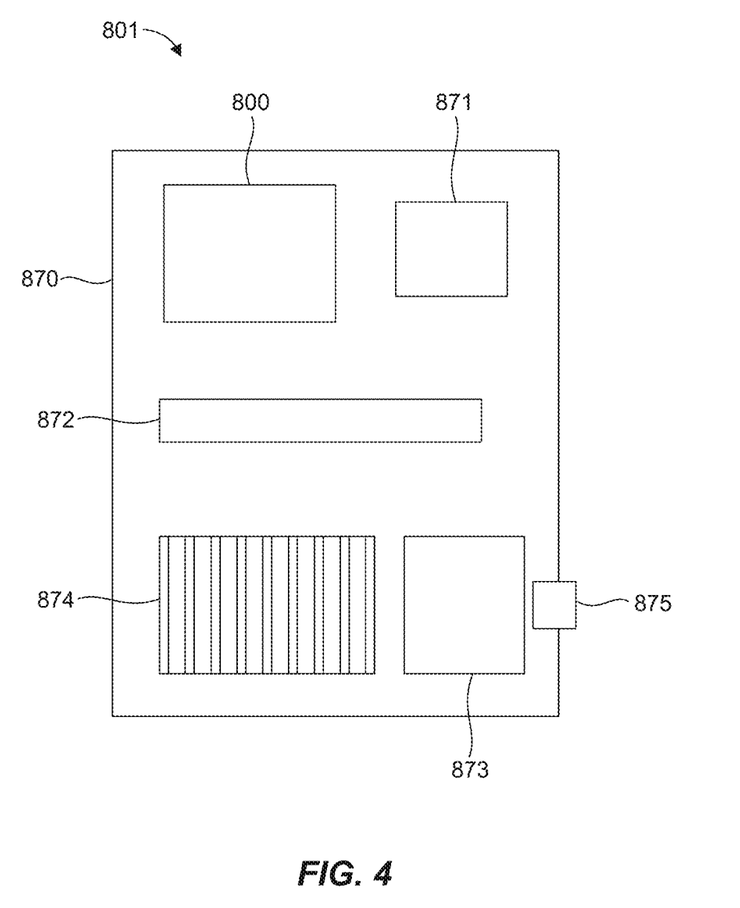
FIG. 4 is a schematic illustration of an exemplary computing system.

FIG. 4 schematically illustrates an example computing system 801. The computing system 801 can include an electronic device package 800 as disclosed herein, coupled to a motherboard 870. In one aspect, the computing system 801 can also include a processor 871, a memory device 872, a radio 873, a cooling system (e.g., a heat sink and/or a heat spreader) 874, a port 875, a slot, or any other suitable device or component, which can be operably coupled to the motherboard 870. The computing system 801 can comprise any type of computing system, such as a desktop computer, a laptop computer, a tablet computer, a smartphone, a server, a wearable electronic device, etc. Other embodiments need not include all of the features specified in FIG. 4, and may include alternative features not specified in FIG. 4.

EXAMPLES

The following examples pertain to further embodiments.

In one example, there is provided an electronic device package comprising a substrate, a plurality of electronic components in a stacked relationship, each of the electronic components being electrically coupled to the substrate via a wire bond connection and spaced apart from an adjacent electronic component to provide clearance for the wire bond connection, and an encapsulant material encapsulating the electronic components, wherein the encapsulant is disposed between center portions of adjacent electronic components.

In one example, an electronic device package comprises at least one spacer separating adjacent electronic components from one another to provide clearance for the wire bond connections.

In one example of an electronic device package, the at least one spacer comprises a polymer.

In one example of an electronic device package, the polymer comprises a thermoset polymer, a thermoplastic polymer, or a combination thereof.

In one example of an electronic device package, the polymer comprises an epoxy.

In one example of an electronic device package, the at least one spacer comprises a bump configuration.

In one example of an electronic device package, the bump configuration comprises an elongated bump configuration.

In one example of an electronic device package, the bump configuration comprises a dot bump configuration.

In one example of an electronic device package, the at least one spacer comprises a silicon spacer.

In one example of an electronic device package, the at least one spacer comprises a film over wire (FOW).

In one example of an electronic device package, the at least one spacer is disposed at least partially over one or more of the wire bond connections.

In one example of an electronic device package, the at least one spacer is disposed between laterally adjacent wire bond connections.

In one example of an electronic device package, the at least one spacer is disposed partially between the center portions of adjacent electronic components.

In one example of an electronic device package, the at least one spacer is disposed between peripheral portions of adjacent electronic components.

In one example of an electronic device package, the at least one spacer is in contact with opposing surfaces of adjacent electronic components, and an interface area of the at least one spacer and one of the opposing surfaces is less than or equal to 10% of a surface area of the opposing surface.

In one example of an electronic device package, the encapsulant is in contact with opposing surfaces of adjacent electronic components, and an interface area of the encapsulant and one of the opposing surfaces is greater than or equal to 50% of a surface area of the opposing surface.

In one example of an electronic device package, adjacent electronic components are spaced apart from one another by a distance of at least 30 µm.

In one example of an electronic device package, adjacent electronic components are spaced apart from one another by a distance of no more than 300 µm.

In one example of an electronic device package, the an encapsulant material comprises an epoxy.

In one example of an electronic device package, at least one of the electronic components comprises computer memory.

In one example of an electronic device package, at least one of the electronic components comprises an integrated circuit.

In one example of an electronic device package, the electronic components are identical.

In one example of an electronic device package, the substrate is configured to facilitate electrically coupling the electronic device package with an external electronic component.

In one example, an electronic device package comprises a plurality of solder balls coupled to the substrate to facilitate electrically coupling the electronic device package with the external electronic component.

In one example, there is provided an electronic device package precursor comprising a substrate, a plurality of electronic components in a stacked relationship, each of the electronic components being electrically coupled to the substrate via a wire bond connection and spaced apart from an adjacent electronic component to provide clearance for the wire bond connection, and at least one spacer separating adjacent electronic components from one another to provide clearance for the wire bond connections, wherein the at least one spacer is in contact with opposing surfaces of adjacent electronic components, and an interface area of the at least one spacer and one of the opposing surfaces is less than or equal to 10% of a surface area of the opposing surface.

In one example of an electronic device package precursor, the at least one spacer comprises a polymer.

In one example of an electronic device package precursor, the polymer comprises a thermoset polymer, a thermoplastic polymer, or a combination thereof.

In one example of an electronic device package precursor, the polymer comprises an epoxy.

In one example of an electronic device package precursor, the at least one spacer comprises a bump configuration.

In one example of an electronic device package precursor, the bump configuration comprises an elongated bump configuration.

In one example of an electronic device package precursor, the bump configuration comprises a dot bump configuration.

In one example of an electronic device package precursor, the at least one spacer comprises a silicon spacer.

In one example of an electronic device package precursor, the at least one spacer comprises a film over wire (FOW).

In one example of an electronic device package precursor, the at least one spacer is disposed at least partially over one or more of the wire bond connections.

In one example of an electronic device package precursor, the at least one spacer is disposed between laterally adjacent wire bond connections.

In one example of an electronic device package precursor, the at least one spacer is disposed partially between center portions of adjacent electronic components.

In one example of an electronic device package precursor, the at least one spacer is disposed between peripheral portions of adjacent electronic components.

In one example of an electronic device package precursor, adjacent electronic components are spaced apart from one another by a distance of at least 30 μm.

In one example of an electronic device package precursor, adjacent electronic components are spaced apart from one another by a distance of no more than 300 μm.

In one example of an electronic device package precursor, at least one of the electronic components comprises computer memory.

In one example of an electronic device package precursor, at least one of the electronic components comprises an integrated circuit.

In one example of an electronic device package precursor, the electronic components are identical.

In one example of an electronic device package precursor, the substrate is configured to facilitate electrically coupling the electronic device package with an external electronic component.

In one example, there is provided a computing system comprising a motherboard, and an electronic device package operably coupled to the motherboard. The electronic device package comprises a substrate, a plurality of electronic components in a stacked relationship, each of the electronic components being electrically coupled to the substrate via a wire bond connection and spaced apart from an adjacent electronic component to provide clearance for the wire bond connection, and an encapsulant material encapsulating the electronic components, wherein the encapsulant is disposed between center portions of adjacent electronic components.

In one example of a computing system, the computing system comprises a desktop computer, a laptop, a tablet, a smartphone, a server, a wearable electronic device, or a combination thereof.

In one example of a computing system, the computing system further comprises a processor, a memory device, a cooling system, a radio, a slot, a port, or a combination thereof operably coupled to the motherboard.

In one example there is provided a method for making an electronic device package comprising forming a wire bond connection between a first electronic component and a substrate, forming at least one spacer on the first electronic component, a second electronic component, or both, and disposing the second electronic component on the first electronic component in a stacked relationship, wherein the at least one spacer separates the first and second electronic components from one another to provide clearance for the wire bond connection, and wherein the at least one spacer is in contact with opposing surfaces of the first and second electronic components, and an interface area of the at least one spacer and one of the opposing surfaces is less than or equal to 10% of a surface area of the opposing surface.

In one example, a method for making an electronic device package comprises encapsulating the first and second electronic components in an encapsulant material.

In one example of a method for making an electronic device package, the encapsulant material is disposed between center portions of the first and second electronic components.

In one example of a method for making an electronic device package, the encapsulant material is in contact with opposing surfaces of the first and second electronic components, and an interface area of the encapsulant and one of the opposing surfaces is greater than or equal to 50% of a surface area of the opposing surface.

In one example of a method for making an electronic device package, forming the at least one spacer comprises dispensing a viscous material on the first electronic component, the second electronic component, or both.

In one example of a method for making an electronic device package, the viscous material comprises a liquid, a paste, or a combination thereof.

In one example of a method for making an electronic device package, forming the at least one spacer comprises disposing a pre-formed material on the first electronic component, the second electronic component, or both.

In one example of a method for making an electronic device package, forming the at least one spacer comprises laminating one or more layers of material on the first electronic component, the second electronic component, or both.

In one example of a method for making an electronic device package, the at least one spacer comprises a polymer.

In one example of a method for making an electronic device package, the polymer comprises a thermoset polymer, a thermoplastic polymer, or a combination thereof.

In one example of a method for making an electronic device package, the polymer comprises an epoxy.

In one example, a method for making an electronic device package comprises at least partially curing the polymer.

In one example of a method for making an electronic device package, at least partially curing the polymer comprises heating the polymer.

In one example of a method for making an electronic device package, the at least one spacer comprises a bump configuration.

In one example of a method for making an electronic device package, the bump configuration comprises an elongated bump configuration.

In one example of a method for making an electronic device package, the bump configuration comprises a dot bump configuration.

In one example of a method for making an electronic device package, the at least one spacer comprises a silicon spacer.

In one example of a method for making an electronic device package, the at least one spacer comprises a film over wire (FOW).

In one example of a method for making an electronic device package, the at least one spacer is disposed at least partially over the wire bond connection.

In one example of a method for making an electronic device package, the wire bond connection comprises a plurality of laterally spaced wire bond connections, and the at least one spacer is disposed between adjacent wire bond connections.

In one example of a method for making an electronic device package, the at least one spacer is disposed partially between the center portions of the first and second electronic components.

In one example of a method for making an electronic device package, the at least one spacer is disposed between peripheral portions of the first and second electronic components.

In one example of a method for making an electronic device package, the encapsulant material comprises a mold compound.

In one example of a method for making an electronic device package, the mold compound comprises an epoxy.

In one example of a method for making an electronic device package, the at least one spacer separates the first and second electronic components from one another by a distance of at least 30 µm.

In one example of a method for making an electronic device package, the at least one spacer separates the first and second electronic components from one another by a distance of no more than 300 µm.

In one example, a method for making an electronic device package comprises forming a second wire bond connection between the second electronic component and the substrate.

In one example, a method for making an electronic device package comprises forming at least one second spacer on the second electronic component, a third electronic component, or both, and disposing the third electronic component on the second electronic component in a stacked relationship, wherein the at least one second spacer separates the second and third electronic components from one another to provide clearance for the second wire bond connection.

In one example of a method for making an electronic device package, the at least one second spacer is in contact with opposing surfaces of the second and third electronic components, and an interface area of the at least one second spacer and one of the opposing surfaces is less than or equal to 10% of a surface area of the opposing surface.

In one example of a method for making an electronic device package, the at least one second spacer comprises a polymer.

In one example, a method for making an electronic device package comprises at least partially curing the polymer.

In one example of a method for making an electronic device package, at least partially curing the polymer comprises heating the polymer.

In one example, a method for making an electronic device package comprises forming a third wire bond connection between the third electronic component and the substrate.

In one example of a method for making an electronic device package, at least one of the first and second electronic components comprises computer memory.

In one example of a method for making an electronic device package, at least one of the first and second electronic components comprises an integrated circuit.

In one example of a method for making an electronic device package, the first and second electronic components are identical.

In one example, a method for making an electronic device package comprises configuring the substrate to facilitate electrically coupling the electronic device package with an external electronic component.

In one example, a method for making an electronic device package comprises coupling a plurality of solder balls to the substrate to facilitate electrically coupling the electronic device package with the external electronic component.

Circuitry used in electronic components or devices (e.g. a die) of an electronic device package can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. An electronic device package, comprising:
a substrate; a plurality of electronic components in a stacked relationship, each of the electronic components being electrically coupled to the substrate via a wire bond connection and spaced apart from an adjacent electronic component by plurality of spacers a bump configuration to provide clearance for the wire bond connection, wherein the wire bond connection comprises three or more wire bonds along a side of a perimeter of the electronic component, and wherein the one or more spacers are along the side of the perimeter; and an encapsulant material encapsulating the electronic components, wherein a first portion of the encapsulant material is disposed between center portions of adjacent electronic components, a second portion of the encapsulant material is on a top surface of an uppermost one of the plurality of electronic components, and a third portion of the encapsulant material is along lateral sides each of the plurality of electronic components, and wherein the first, second and third portions of the encapsulant material are continuous with one another, wherein at least one or more spacers of the plurality of spacers comprises a silicon spacer.

2. The electronic device package of claim 1, wherein at least one or more spacers of the plurality of spacers comprises a polymer.

3. The electronic device package of claim 2, wherein the polymer comprises a thermoset polymer, a thermoplastic polymer, or a combination thereof.

4. The electronic device package of claim 2, wherein the polymer comprises an epoxy.

5. The electronic device package of claim 1, wherein the bump configuration comprises an elongated bump configuration.

6. The electronic device package of claim 1, wherein the bump configuration comprises a dot bump configuration.

7. The electronic device package of claim 1, wherein at least one or more spacers of the plurality of spacers comprises a film over wire (FOW).

8. The electronic device package of claim 1, wherein at least one or more spacers of the plurality of spacers is disposed at least partially over one or more of the wire bond connections.

9. The electronic device package of claim 1, wherein at least one or more spacers of the plurality of spacers is disposed between laterally adjacent wire bond connections.

10. The electronic device package of claim 1, wherein at least one or more spacers of the plurality of spacers is disposed partially between the center portions of adjacent electronic components.

11. The electronic device package of claim 1, wherein at least one or more spacers of the plurality of spacers is disposed between peripheral portions of adjacent electronic components.

12. The electronic device package of claim 1, wherein at least one or more spacers of the plurality of spacers is in contact with opposing surfaces of adjacent electronic components, and an interface area of the at least one spacer and one of the opposing surfaces is less than or equal to 10% of a surface area of the opposing surface.

13. The electronic device package of claim 1, wherein the encapsulant is in contact with opposing surfaces of adjacent electronic components, and an interface area of the encapsulant and one of the opposing surfaces is greater than or equal to 50% of a surface area of the opposing surface.

14. The electronic device package of claim 1, wherein adjacent electronic components are spaced apart from one another by a distance of at least 30 μm.

15. The electronic device package of claim 1, wherein adjacent electronic components are spaced apart from one another by a distance of no more than 300 μm.

16. The electronic device package of claim 1, wherein the encapsulant material comprises an epoxy.

17. The electronic device package of claim 1, wherein at least one of the electronic components comprises computer memory.

18. The electronic device package of claim 1, wherein at least one of the electronic components comprises an integrated circuit.

19. The electronic device package of claim 1, wherein the electronic components are identical.

20. The electronic device package of claim 1, wherein the substrate is configured to facilitate electrically coupling the electronic device package with an external electronic component.

21. The electronic device package of claim 20, further comprising a plurality of solder balls coupled to the substrate to facilitate electrically coupling the electronic device package with the external electronic component.

* * * * *